United States Patent [19]

Nakai

[11] Patent Number: 4,470,061

[45] Date of Patent: Sep. 4, 1984

[54] INTEGRATED INJECTION LOGIC

[75] Inventor: Masanori Nakai, Ebina, Japan

[73] Assignee: Tokyo Shibaura Denki Kabushiki Kaisha, Japan

[21] Appl. No.: 336,275

[22] Filed: Dec. 31, 1981

[30] Foreign Application Priority Data

Jan. 13, 1981 [JP] Japan .................................. 56-3630

[51] Int. Cl.³ .................... H01L 27/04; H03K 19/091
[52] U.S. Cl. ........................................ 357/46; 357/86; 357/92
[58] Field of Search ............................ 357/92, 44, 46; 307/459, 477

[56] References Cited

U.S. PATENT DOCUMENTS

| | | | |
|---|---|---|---|
| 4,009,397 | 2/1977 | Mulder et al. | 357/92 |
| 4,080,577 | 3/1978 | Asada et al. | 357/92 |
| 4,243,896 | 1/1981 | Chapron | 357/92 |
| 4,286,177 | 8/1981 | Hart et al. | 357/92 |
| 4,385,433 | 5/1983 | Ozawa | 357/92 |

FOREIGN PATENT DOCUMENTS 3010035 1/1981 Fed. Rep. of Germany .
55-32225 8/1980 Japan .

Primary Examiner—William D. Larkins
Attorney, Agent, or Firm—Finnegan, Henderson, Farabow, Garrett & Dunner

[57] ABSTRACT

An integrated injection logic having a first semiconductor region of first conductivity type, a second semiconductor region of second conductivity type formed in the first semiconductor region, a plurality of third semiconductor regions of first conductivity type formed in the second semiconductor region, and a fourth semiconductor region of second conductivity type formed in the first semiconductor region. A fifth semiconductor region of second conductivity type is formed in the first semiconductor region and in the vicinity of the second semiconductor region and is connected to one of the plurality of third semiconductor regions in order to eliminate minority carriers stored in the first semiconductor region and the second semiconductor region.

3 Claims, 6 Drawing Figures

INTEGRATED INJECTION LOGIC

BACKGROUND OF THE INVENTION

The present invention relates to an integrated injection logic.

An integrated injection logic (I²L) does not require isolation between semiconductor elements even though the integrated injection logic is a bipolar transistor. Therefore, such a semiconductor device is highly integrated. Further, since a lateral pnp transistor is used as a current source or load, power consumption is greatly reduced.

An integrated injection logic (to be referred to as an I²L hereinafter) comprises an n+-type semiconductor substrate, an n-type epitaxial layer which is formed on the semiconductor substrate, a p-type injector region which is formed in this epitaxial layer, a p-type layer which is formed in the epitaxial layer, and a plurality of n-type regions which are formed in the p-type layer. In the I²L with the above arrangement, minority carriers are excessively accumulated in the n-type expitaxial layer and the p-type layer which is formed in the n-type epitaxial layer when the I²L operates, reducing the switching speed of the device.

In order to solve this problem, a device is disclosed in Japanese Patent Publication (KOKOKU)JP, B2,55-32225. The present invention provides a device which further improves the device proposed in the above publication.

SUMMARY OF THE INVENTION

It is an object of the present invention to provide an integrated injection logic which operates with high switching speed.

In order to achieve the above and other objects of the present invention, there is provided an integrated injection logic in which a first semiconductor region of the same conductivity type as a base region is formed in the vicinity of the base region of a bipolar transistor which functions as an inverter of the integrated injection logic, and a second semiconductor region whose conductivity type is opposite to that of the base region and which is formed in the base region and connected to this first semiconductor region.

With the above arrangement, minority carriers which are stored in the base region and the emitter region of the bipolar transistor are eliminated through the first semiconductor region in the vicinity of the base region. Therefore, the switching operation of the integrated injection logic is accomplished with high speed.

Especially, when a potential difference between the first semiconductor region and the semiconductor region which stores the minority carriers is established, the minority carriers may be eliminated in accordance with the potential difference.

BRIEF DESCRIPTION OF THE DRAWINGS

Other objects and advantages of the present invention will become apparent from the following detailed description when taken in conjunction with the accompanying drawings in which.

DETAILED DESCRIPTION OF THE PREFERRED EMOBODIMENTS

Figure 1:
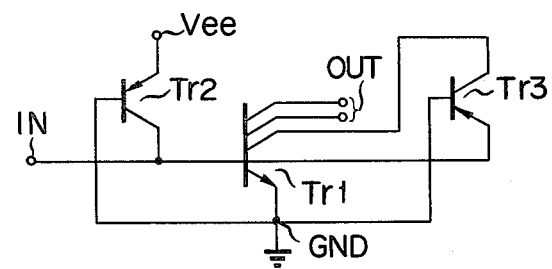
FIG. 1 is a circuit diagram of an I²L of the present invention.

An integrated injection logic (I²L) according to a first embodiment of the present invention will be described with reference to FIGS. 1 to 3. FIG. 1 is a circuit diagram of an I²L according to the present invention. The I²L comprises a first transistor Tr1 which has a plurality of output ends OUT and functions as an inverter, a second transistor Tr2 which functions as a current source and load for the first transistor Tr1, and a third transistor Tr3 connected to the first transistor Tr1. The emitter of the first transistor Tr1 of the npn type is grounded, the base thereof is connected to an input signal supply end IN, and the collector thereof functions as the output ends. The emitter of the second transistor Tr2 of the pnp type is connected to a power source voltage supply end Vee, the base thereof is grounded, and the collector thereof is connected to the base of the first transistor Tr1. The collector of the third transistor Tr3 of the pnp type is connected to one of the output ends OUT of the first transistor Tr1, the base thereof is grounded, and the emitter thereof is connected to the base of the first transistor Tr1. The third transistor Tr3 operates to eliminate excessive minority carriers which are stored in the base and emitter of the first transistor Tr1 in response to the operation of the first transistor Tr1.

Figure 2:
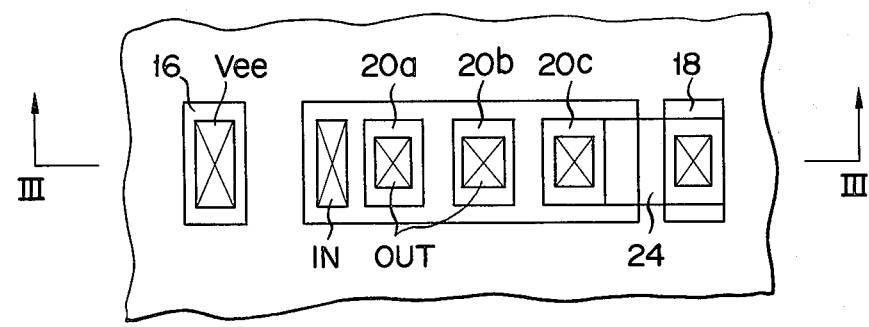
FIG. 2 is a plan view of a first embodiment of the I²L according to the present invention.
Figure 3:
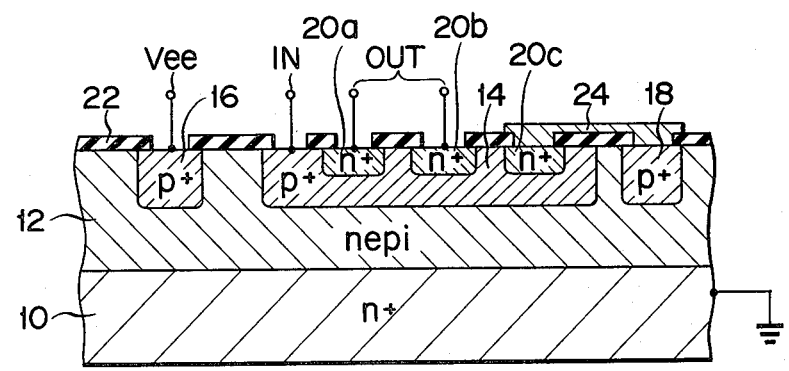
FIG. 3 is a sectional view along the line III—III of FIG. 2.

FIGS. 2 and 3 show detailed arrangements of the device of the circuit diagram shown in FIG. 1, in which FIG. 2 is a plan view of the device, and FIG. 3 is a sectional view thereof along the line III—III of FIG. 2.

An n-type epitaxial layer 12 is formed on an n+-type semiconductor substrate 10. A first semiconductor region 14 of p+conductivity type, a second semiconductor region 16 of p+conductivity type, and a third semiconductor region 18 of p+conductivity type are formed in the n-type epitaxial layer 12. Three fourth semiconductor regions 20a, 20b and 20c of n+conductivity type are formed in the first semiconductor region 14. The first transistor Tr1 comprises the epitaxial layer 12, the first semiconductor region 14 and the fourth semiconductor regions 20a and 20b. The epitaxial layer 12 functions as the emitter of the first transistor Tr1, the first semiconductor region 14 functions as the base thereof, and the fourth semiconductor layers 20a and 20b function as the collector thereof. The second transistor Tr2 comprises the second semiconductor region 16, the epitaxial layer 12 and the first semiconductor region 14. The second semiconductor region 16 functions as the emitter of the second transistor Tr2, the epitaxial layer 12 functions as the base thereof, and the first semiconductor region 14 functions as the collector thereof. The third transistor Tr3 comprises the first semiconductor region 14, the epitaxial layer 12, and the third semiconductor region 18. The first semiconductor region 14 functions as the emitter of the third transistor Tr3, the epitaxial layer 12 functions as the base thereof, and the third semiconductor region 18 functions as the collector thereof. An SiO₂ film 22 in which contact holes are selectively formed is formed on the surface of the semiconductor substrate. The second semiconductor region 16 is connected to the power source voltage supply end Vee through the contact hole, and the first semiconductor region 14 is connected to the input signal supply end IN through the contact hole, and the fourth semiconductor regions 20a and 20b are respectively connected to the output ends OUT. The third semiconductor region 18 is connected to the fourth semiconductor region 20c through an electrode wiring 24.

With the above arrangement, when the first transistor Tr1 is saturated, a base current which is injected to the base (first semiconductor region 14) of the first transistor Tr1 and the excessive minority carriers stored in the n-type epitaxial layer 12 under the base of the transistor Tr1, are directed to the collector of the first transistor Tr1 through the third transistor Tr3. Therefore, an effective current amplification factor βeff of the first transistor Tr1 is reduced, while a cut-off frequency fT of the first transistor Tr1 is increased, resulting in the high switching speed operation. Further, when a proper potential difference is established between the third semiconductor region 18 and the epitaxial layer 12, the minority carriers are eliminated in accordance with the potential difference.

The above results will be described with reference to equations below. A delay time tpd of the I²L is defined by the following equation (Fransois M. Klaassen, "Device Physics of Integrated Injection Logic", IEEE Transaction Electron Devices, Vol. ED 22, March 1975, pp. 145–152)

$$tpd = \sqrt{\beta_{eff}} /2\pi fT \quad (1)$$

The effective current amplification factor βeff and the cut-off frequency fT of the transistor tr1 are defined by the following equations.

$$\beta_{eff} = \beta_{upo}/(1+\beta_i) \quad (2)$$

$$fT = ic/2\pi Q_{epi} \quad (3)$$

where βupo is the current amplification factor of the transistor Tr1 when the injector (second transistor Tr2) is open, βi is the reverse current amplification factor of the injector, ic is the collector current of the first transistor Tr1, and Qepi is the number of minority carriers stored in the epitaxial layer 12.

Since the base current injected to the base of the first transistor Tr1 is directed to the third transistor Tr3 in the I²L shown in FIGS. 2 and 3, the reverse current amplification factor βi of the injector is increased. Further, since the minority carriers generated in the epitaxial layer 12 are absorbed in the collector region 18 of the third transistor Tr3, the number Qepi of minority carriers is reduced. According to equation (2), the effective current amplification factor βeff of the first transistor Tr1 is reduced. The cut-off frequency fT of the first transistor Tr1 increases according to equation (3). As a result, the delay time tpd of the I²L is shortened according to equation (1).

Figure 4:
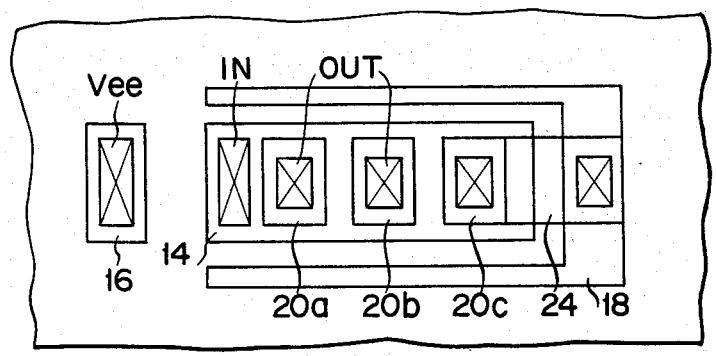
FIG. 4 is a plan view of a second embodiment of an I²L according to the present invention.

An I²L of a second embodiment of the present invention will be described with reference to FIG. 4. The I²L according to this embodiment is the same as that shown in FIGS. 2 and 3 except that the collector of the third transistor Tr3 is arranged to surround the first transistor Tr1. The same reference numerals in FIG. 4 denote the same parts as in FIGS. 2 and 3, and the detailed description will be omitted. With this arrangement, the excessive carriers are effectively removed so that the switching speed of the I²L is further improved.

Figure 5:
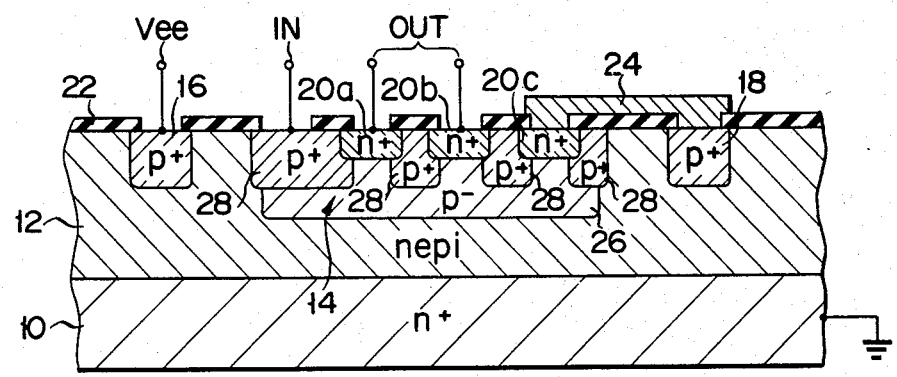
FIG. 5 is a sectional view of a third embodiment of an I²L according to the present invention.

An I²L of a third embodiment of the present invention will be described with reference to FIG. 5. The I²L of this embodiment is the same as that in FIG. 3, except that the first semiconductor region 14 which functions as the base of the first transistor Tr1 is formed by a first semiconductor layer 26 of p⁻conductivity type and a second semiconductor layer 28 of p⁺conductivity type, in which the second semiconductor layer 28 is connected to the input signal supply end IN and arranged to surround the fourth semiconductor regions 20a, 20b and 20c. The same reference numerals in FIG. 5 denote the same parts as in FIG. 3, and the detailed description thereof will be omitted. With this arrangement, the minority carriers are effectively eliminated so that the switching speed of the I²L is greatly improved.

Figure 6:
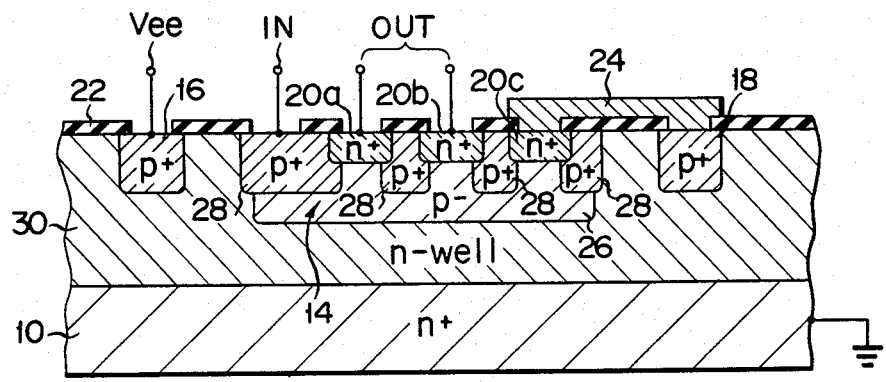
FIG. 6 is a sectional view of a fourth embodiment of an I²L according to the present invention.

An I²L of a fourth embodiment of the present invention will be described with reference to FIG. 6. The I²L in this embodiment is the same as that shown in FIG. 5, except that an n-type well layer 30 is selectively formed in the semiconductor substrate 10 instead of the n-type epitaxial layer in order to form the emitter region of higher concentration. The same reference numerals in FIG. 6 denote the same parts as in FIG. 5, and the detailed description thereof will be omitted. The same effect as in the previous embodiments is accomplished, in which the minority carriers are effectively eliminated and the switching operation of the I²L is accomplished with high speed.

What is claimed is:

1. An integrated injection logic comprising:
   a first semiconductor region of first conductivity type;
   a second semiconductor region of second conductivity type formed in said first semiconductor region;
   a plurality of third semiconductor regions of first conductivity type formed in said second semiconductor region;
   a fourth semiconductor region of second conductivity type formed in said first semiconductor region; and
   a fifth semiconductor region of second conductivity type which is formed in said first semiconductor region and in the vicinity of said second semiconductor region, and which is connected to one of said plurality of third semiconductor regions,
   said first semiconductor region, said second semiconductor region and said fifth semiconductor region comprising a transistor that eliminates minority carriers stored in said first semiconductor region and said second semiconductor region upon saturation of at least said first semiconductor region.

2. An integrated injection logic according to claim 1, wherein said first semiconductor region is an epitaxial layer.

3. An integrated injection logic according to one of the preceding claims, wherein said second semiconductor region comprises a first semiconductor layer and a second semiconductor layer which is in contact with said third semiconductor region and which has an impurity of a concentration higher than a concentration of an impurity of said first semiconductor layer.

* * * * *